US009502558B2

(12) United States Patent
Reboh et al.

(10) Patent No.: US 9,502,558 B2
(45) Date of Patent: Nov. 22, 2016

(54) LOCAL STRAIN GENERATION IN AN SOI SUBSTRATE

(71) Applicants: Commissariat a L'Energie Atomique et aux Energies Alternatives, Paris (FR); STMICROELECTRONICS (CROLLES 2) SAS, Crolles (FR)

(72) Inventors: Shay Reboh, Sassenage (FR); Laurent Grenouillet, Rives (FR); Cyrille Le Royer, Tullins Fures (FR); Sylvain Maitrejean, Grenoble (FR); Yves Morand, Grenoble (FR)

(73) Assignees: Commissariat a l'energie atomique et aux energies alternatives, Paris (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 14/791,713

(22) Filed: Jul. 6, 2015

(65) Prior Publication Data

US 2016/0005862 A1 Jan. 7, 2016

(30) Foreign Application Priority Data

Jul. 7, 2014 (FR) ...................................... 14 56521

(51) Int. Cl.
*H01L 29/78* (2006.01)
*H01L 21/02* (2006.01)
*H01L 21/265* (2006.01)
*H01L 29/66* (2006.01)

(52) U.S. Cl.
CPC ..... *H01L 29/7847* (2013.01); *H01L 21/02532* (2013.01); *H01L 21/02592* (2013.01); *H01L 21/02667* (2013.01); *H01L 21/26506* (2013.01); *H01L 29/66772* (2013.01); *H01L 29/7849* (2013.01); *H01L 29/66477* (2013.01)

(58) Field of Classification Search
CPC ................... H01L 21/02689; H01L 27/1203; H01L 21/02686; H01L 21/02381; H01L 29/78651; H01L 29/1054; H01L 21/7624; H01L 21/84; H01L 21/02667; H01L 21/02488; H01L 29/66651; H01L 21/26506; H01L 21/02532; H01L 29/78654; H01L 29/7846; H01L 29/7843; H01L 29/66772; H01L 29/045

See application file for complete search history.

(56) References Cited

U.S. PATENT DOCUMENTS

| | | | |
|---|---|---|---|
| 2006/0014366 A1* | 1/2006 | Currie | H01L 21/76254 438/517 |
| 2006/0046366 A1* | 3/2006 | Orlowski | H01L 29/0653 438/198 |
| 2007/0012960 A1* | 1/2007 | Knoefler | H01L 21/26506 257/288 |
| 2007/0020867 A1* | 1/2007 | Ieong | H01L 29/78696 438/301 |
| 2007/0281435 A1* | 12/2007 | Thean | H01L 21/823412 438/400 |

(Continued)

OTHER PUBLICATIONS

U.S. Appl. No. 14/425,891, filed Mar. 4, 2015, Laurent Grenouillet et al.
U.S. Appl. No. 14/719,580, filed May 22, 2015, Laurent Grenouillet et al.
French Preliminary Search Report issued Mar. 2, 2015 for French Application 14 56521, filed on Jul. 7, 2014 (with English Translation of Categories of Cited Documents).

(Continued)

*Primary Examiner* — Jessica Manno
*Assistant Examiner* — Mohammed R Alam
(74) *Attorney, Agent, or Firm* — Oblon, McClelland, Maier & Neustadt, L.L.P.

(57) ABSTRACT

Method to strain a channel zone of a transistor of the semiconductor on insulator type transistor that makes use of an SMT stress memorization technique in which regions located under the insulation layer of the substrate (FIG. 6) are amorphized, before the transistor gate is made.

9 Claims, 8 Drawing Sheets

(56) References Cited

U.S. PATENT DOCUMENTS

| | | |
|---|---|---|
| 2007/0290264 A1 | 12/2007 | Sugii et al. |
| 2008/0026572 A1* | 1/2008 | Wirbeleit .......... H01L 21/26513 438/663 |
| 2011/0254092 A1 | 10/2011 | Yang et al. |
| 2011/0291100 A1* | 12/2011 | Cheng ................ H01L 29/7841 257/66 |
| 2012/0313168 A1 | 12/2012 | Cheng et al. |
| 2013/0146895 A1 | 6/2013 | Tsai et al. |
| 2013/0146952 A1* | 6/2013 | Adam ..................... H01L 29/94 257/296 |
| 2013/0273722 A1 | 10/2013 | Morand et al. |
| 2014/0015009 A1 | 1/2014 | Le Royer et al. |
| 2014/0326955 A1 | 11/2014 | Barraud et al. |
| 2015/0056734 A1 | 2/2015 | Grenouillet et al. |
| 2015/0155170 A1 | 6/2015 | Reboh et al. |
| 2015/0179474 A1 | 6/2015 | Maitrejean et al. |
| 2015/0179665 A1 | 6/2015 | Reboh et al. |

OTHER PUBLICATIONS

Tzer-Min Shen et al. "Molecular Dynamic Simulation Study of Stress Memorization in Si Dislocations", Electron Devices Meeting (IEDM), 2012 IEEE International, 4 pages.

Kwan-Yong Lim et al. "Novel Stress-Memorization-Technology (SMT) for High Electron Mobility Enhancement of Gate Last High-k/Metal Gate Devices", Electron Devices Meeting (IEDM), 2010 IEEE International, 4 pages.

Y.Y. Wang et al. "Strain Mapping of Si Devices with Stress Memorization Processing" Applied Physics Letters, vol. 103, 2013, 6 pages.

K. Cheng et al. "High Performance Extremely Thin SOI (ETSOI) CMOS with Hybrid Si Channel NFET and Strained SiGe Channel PFET", Electron Devices Meeting (IEDM), 2012 IEEE International, 3 pages.

U.S. Appl. No. 14/849,060, filed Sep. 9, 2015, Maitrejean, et al.

* cited by examiner

LOCAL STRAIN GENERATION IN AN SOI SUBSTRATE

TECHNICAL DOMAIN AND PRIOR ART

This description relates to the field of transistor structures formed on a semiconductor on an insulator type substrate, and more particularly transistor structures with a channel region subjected to a deformation or mechanical strain.

Mechanical deformation refers to a material for which the crystalline lattice parameter(s) has (have) been extended or shortened.

If the deformed lattice parameter is larger than the so-called "natural" lattice parameter of a crystalline material, it is said to be in tension.

When the deformed lattice parameter is smaller than the "natural" lattice parameter, the material is said to be in compressive strain or in compression.

These mechanical deformation states are associated with mechanical strain states. However, it is also common to refer to these deformation states as being mechanical strain states. This concept of deformation will be denoted generically by the term "strain" throughout the remainder of this application.

A strain applied to a semiconducting material induces a modification to the crystalline lattice and therefore to its band structure which will result in a modification to the mobility of carriers in this material.

The mobility of the electrons is increased (or reduced) by a tension (or a compression) strain of the semiconducting material in which the electrons transit, while the mobility of holes will be increased (or reduced) when the semiconducting material is in compression (or in tension).

A technique called the Stress Memorization Technique (SMT) has been developed to generate a strain in a transistor channel.

It consists firstly of amorphisation by ionic implantation of the semiconducting material in the source zone 1 and drain zone 2 of a transistor T (FIG. 1A).

A stressor layer 8 is then deposited based on a material with an intrinsic mechanical strain such as silicon nitride ($Si_xN_y$) on the source and drain zones so as to cover the gate 4 of the transistor, and in particular its side faces on which insulating spacers 5 are provided.

A recrystallisation annealing of the source zone 1 and the drain zone 2 is then done (FIG. 1B). During this recrystallisation annealing, dislocations 9 in the semiconducting material related particularly to the interface between different recrystallisation fronts are generated at the source and drain zones.

These dislocations induce a mechanical strain in the material that can propagate as far as the channel zone 3. The strain applied at the channel is memorised at the time of this annealing.

The stressor layer 8 can then be removed (FIG. 1C).

Such a method is described for example in the document: « Molecular Dynamic Simulation Study of Stress Memorization in Si Dislocations », by Shen et al. IEEE 2012, and in document « Novel Stress Memorization Technology (SMT) for High Electron Mobility Enhancement of Gate Last High-k/Metal Gate Devices », by Lim et al. IEEE 2010, and in document « Strain mapping of Si devices with stress memorization methoding », by Wang et al. Applied Physics Letters 103 (2013).

The use of an SMT type method to strain a channel zone of a transistor formed in the surface layer of a semiconductor on insulator type substrate creates problems, particularly because of the generally low thickness of this layer.

Document US 2011/029110A1 provides a solution to this problem by disclosing a method that makes use of an SMT stress memorisation technique in which the dislocations are formed in the SOI substrate support layer located under the insulating layer commonly referred to as a BOX layer.

This technique is used after the transistor gate has been made on the substrate.

Thus, after forming the transistor gate, regions of the support layer located on each side of the gate are implanted vertically in line with the source and drain zones.

A stressor layer is then deposited on the gate.

Amorphised regions of the support layer that are not facing the transistor gate are then recrystallised.

This method has the disadvantage that the extent of the amorphised zone necessarily depends on the dimensions of the gate, which can create problems, particularly for transistors with long gate lengths. In this case, it may be difficult or even impossible to impose a strain at the centre of the transistor channel zone.

The problem arises of finding a new method for making a strained channel transistor on a semiconductor on insulator type substrate that does not have the disadvantages mentioned above.

PRESENTATION OF THE INVENTION

This invention relates firstly to a method for making a transistor device and particularly a method for straining a channel zone of a transistor on a semiconductor on insulator type substrate comprising a support layer, a surface semiconducting layer and an insulating layer separating the support layer and the surface layer.

One embodiment of this invention thus discloses a method including the following steps:
  form a stencil on a first zone of the surface layer of the substrate in which a channel zone of a transistor is provided;
  make amorphous at least a first region of the support layer located facing a zone of the surface layer that is not protected by the stencil and that is adjacent to a second region of the support layer located facing the stencil;
  recrystallise the first region of the support layer, such that a mechanical strain is applied on the substrate during this recrystallisation through a stressor layer formed on the substrate;
  then, after removing the stencil and the stressor layer:
  form a gate for the transistor on the first zone of the surface layer in which a channel zone of a transistor is provided made.

Thus, dislocations are created in the support layer to induce a mechanical strain in the surface layer and particularly in a zone in which a transistor channel is provided.

These dislocations are formed before the gate is made.

The extent of the zone in which the dislocations are made is thus not necessarily related to the dimensions of the gate.

A better strain can thus be obtained for the channel zone, even for large dimension gates.

According to one possible embodiment, the stressor layer may be a layer with an intrinsic strain and is deposited after the stencil has been formed and before recrystallisation.

According to one embodiment, the stencil may be based on a strained material and forms the stressor layer during the recrystallisation step.

The stencil is advantageously formed from a plurality of separate stencil blocks.

The distribution of masking blocks is adapted as a function of the required density of dislocations.

The stencil may comprise a plurality of openings facing the first zone in which a transistor channel is provided made.

Thus, dislocations can be made in the support layer as close to the channel zone as possible, so as to strain the channel zone even more.

The stencil can thus be configured and arranged such that at least two openings and at least one stencil block located between the two openings are arranged facing the first zone in which a transistor channel is provided.

In this manner, at least one crystalline portion of the support layer that has not been made amorphous is kept after the amorphisation, facing the first zone in which a transistor channel is provided, this portion being located between two regions made amorphous.

It is thus possible to create a plurality of defects or dislocations facing the first zone in which the transistor channel is provided.

In this way, the strain induced in the channel may be greater than it would be in a method in which the region of the support layer facing the channel zone is made entirely amorphous and then recrystallised.

According to one possible embodiment of the method, the stencil may be formed from a network of parallel stencil blocks, the stencil comprising openings also arranged in a network of parallel openings.

The orientation of the stencil blocks and openings may be selected as a function of the direction in which the transistor current will flow.

This orientation may advantageously be made orthogonal to the direction in which the current will flow in the channel zone.

According to one possible embodiment of the method, the surface layer may be designed based on a material that comprises an intrinsic strain, the substrate being a strained semiconductor on insulator type substrate.

In this case, the mechanical strain applied by the stressor layer may be made opposite to the mechanical strain intrinsic to the semiconducting material.

With such a method, when the semiconducting material has an intrinsic bi-axial strain, a mechanical strain can be applied through the stressor layer with sign opposite to the sign of the mechanical strain in an intrinsic strain component of the semiconducting material, and the bi-axial strain intrinsic to the semiconducting material can be transformed into a uniaxial strain.

For example, if the semiconducting material of the surface layer comprises a biaxial strain in compression, a tensile stressor layer can thus improve the current performances of the transistor.

According to one possible embodiment, the substrate may be of the sSiGeOI (« strained Silicon Germanium On Insulator ») type, provided with an SiGe surface layer strained in biaxial compression, the mechanical strain applied in step c) possibly being a mechanical tension strain.

According to one possible embodiment of the method, the transistor may advantageously be of the FDSOI (« Fully Depleted Silicon On Insulator ») type or the UTBB (« Ultra Thin Body and Box ») type.

Thus, the thickness of the surface semiconducting layer may be less than 25 nm and the thickness of the insulating layer may be less than 25 nm.

According to one possible embodiment of the method, the surface layer may be based on an III-V material.

This invention also relates to a transistor device obtained using such a method.

This invention also relates to a strained channel transistor device on a semiconductor on insulator type substrate comprising a support layer based on a semiconducting material, a surface semiconducting layer and an insulating layer separating the support layer from the surface layer, the device including dislocations located under the insulating layer and in the semiconducting material of the support layer, the dislocations being located facing the transistor channel zone. These dislocations are designed to induce a strain in the channel zone of the transistor.

BRIEF DESCRIPTION OF THE DRAWINGS

This invention will be better understood reading the description of example embodiments given purely for information and that is in no way limitative, with reference to the appended drawings on which.

Identical, similar or equivalent parts of the different figures have the same numeric references to facilitate comparisons between these figures.

The different parts shown in figures are not necessarily at a uniform scale, to make the figures more easily readable.

Furthermore, in the following description, terms that depend on the orientation, such as « under », « on », « below », « above », etc. in a structure are applicable assuming that the structure is oriented as shown in the figures.

DETAILED PRESENTATION OF PARTICULAR EMBODIMENTS

A first example method in which a transistor channel supported on a semiconductor on insulator type substrate is strained will be described with reference to FIGS. 2A-2F.

The initial material for this method is a semiconductor on insulator type substrate, for example an SOI (silicon on insulator) type.

Figure 1A:
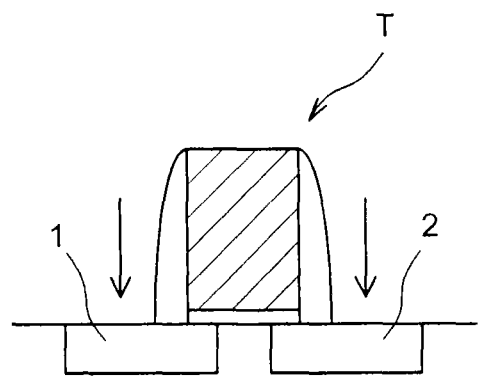
FIGS. 1A-1C illustrate a method for straining the channel of a transistor using a Stress Memorisation Technique (SMT) according to prior art.
Figure 1B:
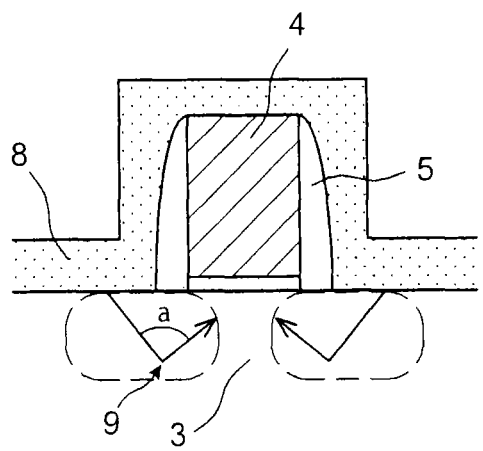
Figure 1C:
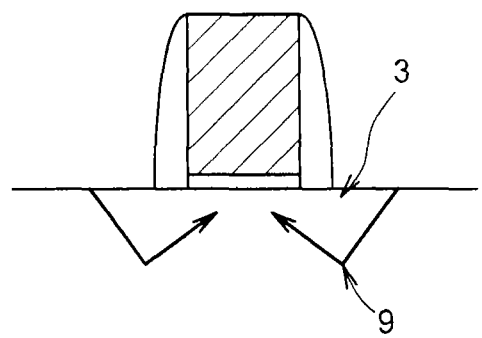
Figure 2A:
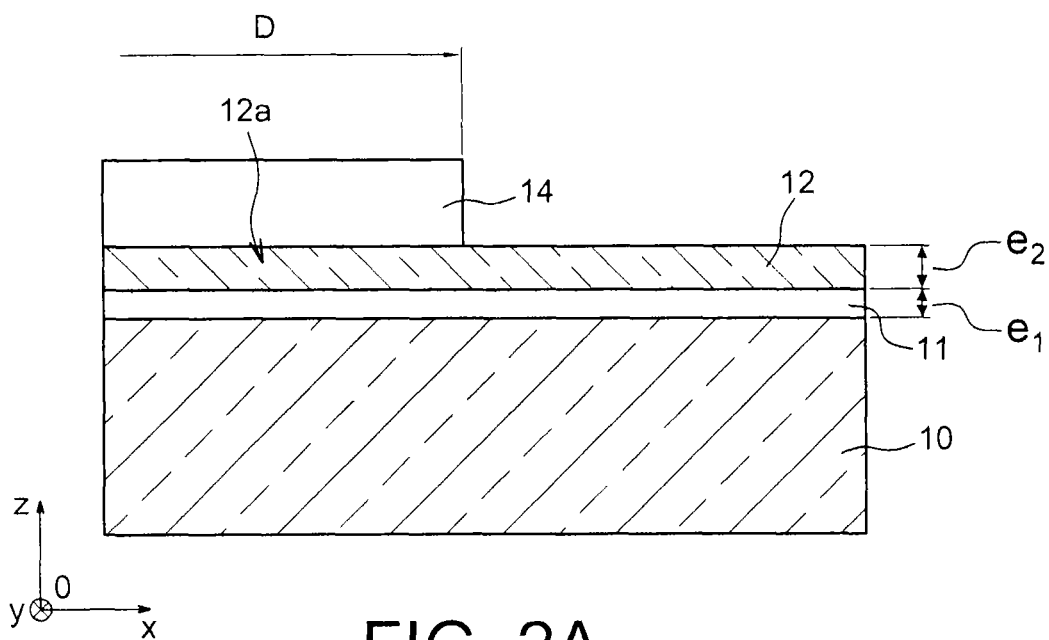
FIGS. 2A-2F illustrate an example of a method to strain a channel of a transistor formed on a semiconductor on insulator type substrate in which dislocations are formed by amorphisation of the regions of the support layer of the substrate through a stencil and then recrystallisation while a mechanical strain is applied on the support, these steps being made before formation of the gate of this transistor.
Figure 2B:
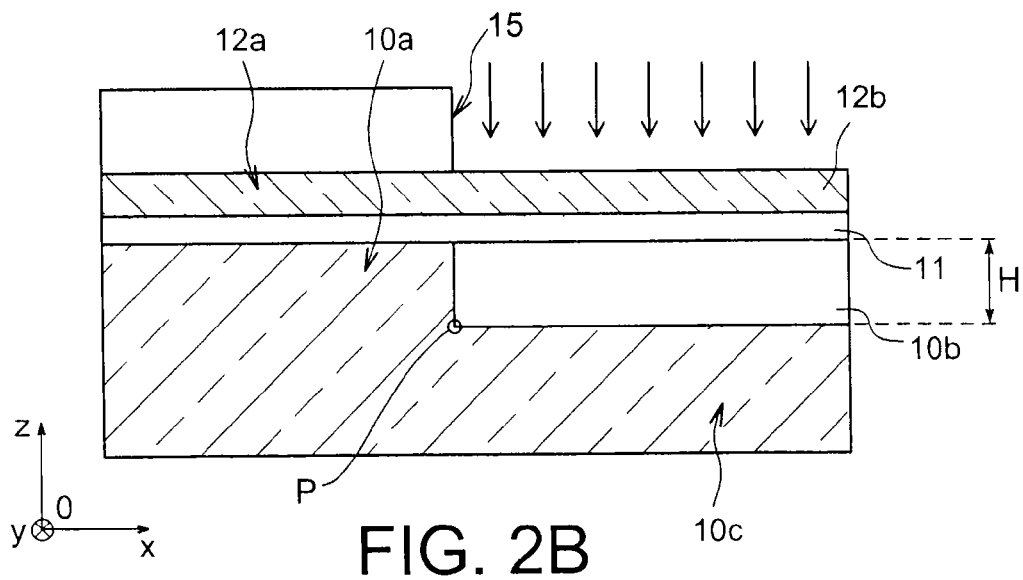
Figure 2C:
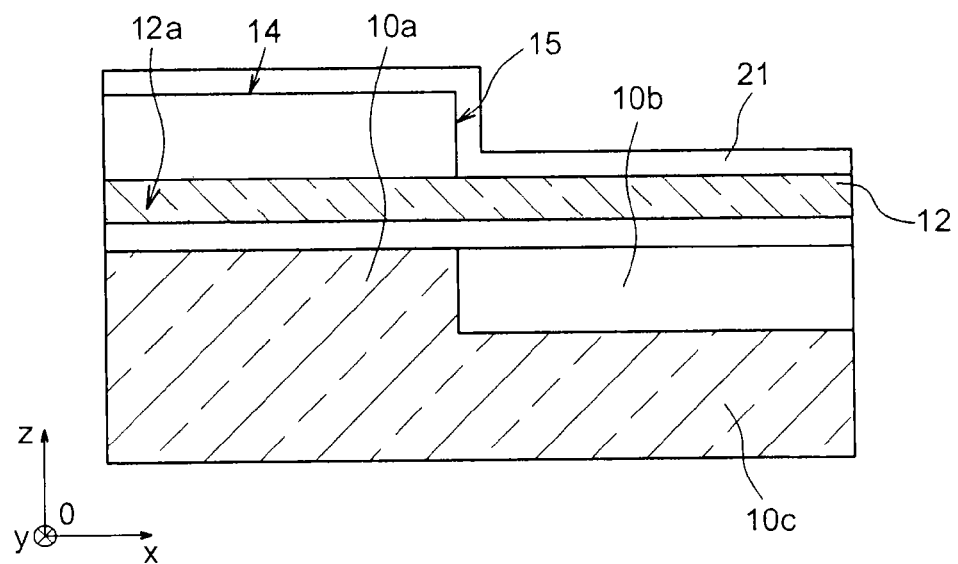

The substrate thus comprises a semiconducting support layer 10, for example based on Si, with a thickness (measured along a direction parallel to the z axis in an orthogonal coordinate system [O; x; y; z] given in FIG. 2A) that may for example be between 40 nm and 750 µm.

The substrate also comprises an insulating layer 11, for example based on $SiO_2$, located on and in contact with the support layer 10. The insulating layer 11 may for example be of the BOX (Buried Oxide) type with a thickness $e_1$ that may for example be between 5 nm and 25 nm.

A semiconducting layer 12 called the «surface» layer, for example based on Si, is placed on and in contact with said insulating layer 11. For example, the thickness $e_2$ of this surface semiconducting layer 12 may be between 3 nm and 25 nm (FIG. 2A).

Firstly, at least one stencil block 14 is formed on the surface semiconducting layer 12, for example based on silicon oxide, with a thickness that may for example be between 60 nm and 120 nm, this thickness range depending on the thickness ranges of the surface and insulating layers.

This stencil block 14 is made facing a first zone 12a of the surface semiconducting layer 12 in which the transistor channel is provided or will be made. The critical dimension D (the «critical dimension» is the smallest dimension of a pattern apart from its thickness or height) of this stencil block 14, also called the width D (measured along a direction parallel to the x axis in FIG. 2A), may for example be equal to between 5 nm and 40 nm.

The next step (FIG. 2B), is a so-called "buried" amorphisation of the first regions 10b of the support layer 10 located under the insulating layer 11 and vertically in line with the second zones 12b of the semiconducting layer 12 that are not protected by the stencil 14 and are adjacent to the first zone 12a of the surface semiconducting layer 12. Transistor source and drain zones may be provided in and on the second zones 12b. The first regions 10b may be adjacent to the insulating layer 11 under which they are located.

Amorphisation is done such that a second region 10a adjacent to the first regions 10b and facing the stencil and protected by it, and a third region 10c located under the first regions 10b, keep their crystalline structures.

The buried amorphisation may be made using at least one ionic implantation step.

According to one example embodiment, when the amorphised semiconducting material is Si, the ionic implantation of regions 10b is implemented using species such as Si, Ge, As, P, Ar, at a dose equal to for example between $10^{14}$ and $5 \times 10^{15}$ cm$^{-2}$ and at an energy for example between 5 and 50 keV, the dose and the energy chosen being dependent on the thicknesses of the layers 12, 11, 10 present.

The height H (measured along a direction parallel to the z axis in FIG. 2B) of regions 10b made amorphous in the support layer may be for example between 40 nm and 90 nm.

The depth of the amorphous regions, and particularly the depth of a point P vertically in line with a side flank 15 of the stencil 14, at the boundary between the first region 10b made amorphous and the second and third crystalline regions 10a, 10c, controls the vertical position of a dislocation to be generated later in the support layer and then the vertical position of the strain field that will result from this dislocation and that is to be imposed on the surface semiconducting layer 12, particularly in its first zone 12a designed to accommodate a transistor channel.

The depth of the amorphous regions and the height H depend on the chosen implantation conditions.

A stressor layer 21 is then formed (FIG. 2C), that will induce a given strain type in the substrate. The stressor layer 21 is deposited so as to cover particularly the side flanks 15 of the block 14 and the surface semiconducting layer 12. This stressor layer 21 may be based on an amorphous material for example such as silicon nitride ($Si_xN_y$) with an intrinsic elastic strain, for example a tension strain of 1 GPa to 3 GPa.

Figure 2D:
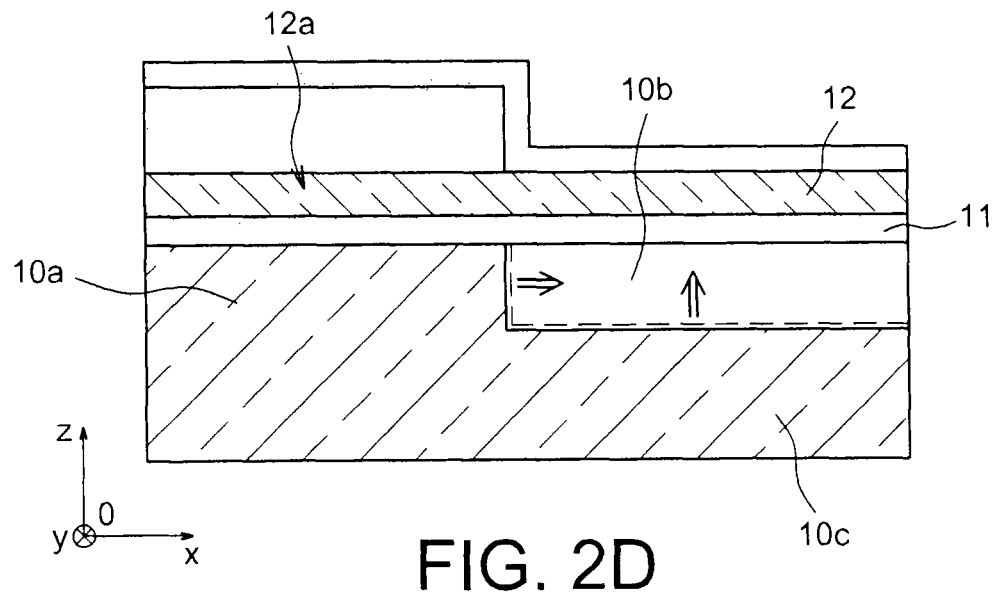
Figure 2E:
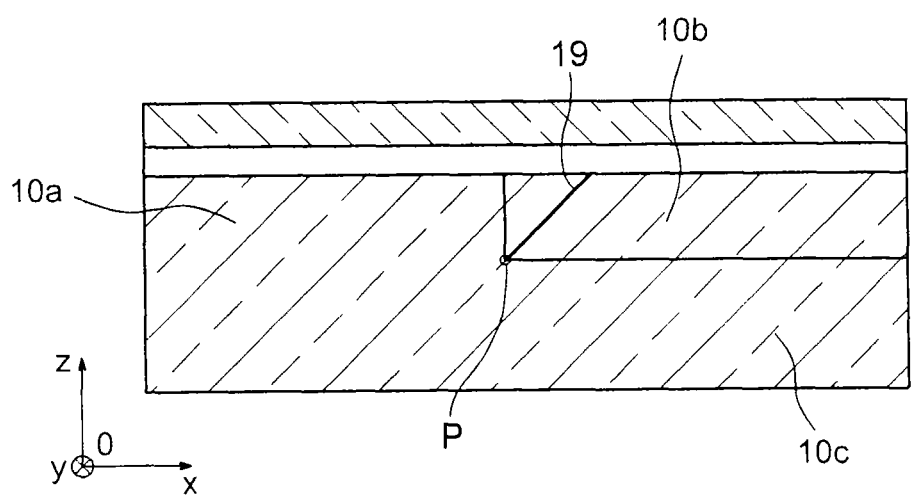
Figure 2F:
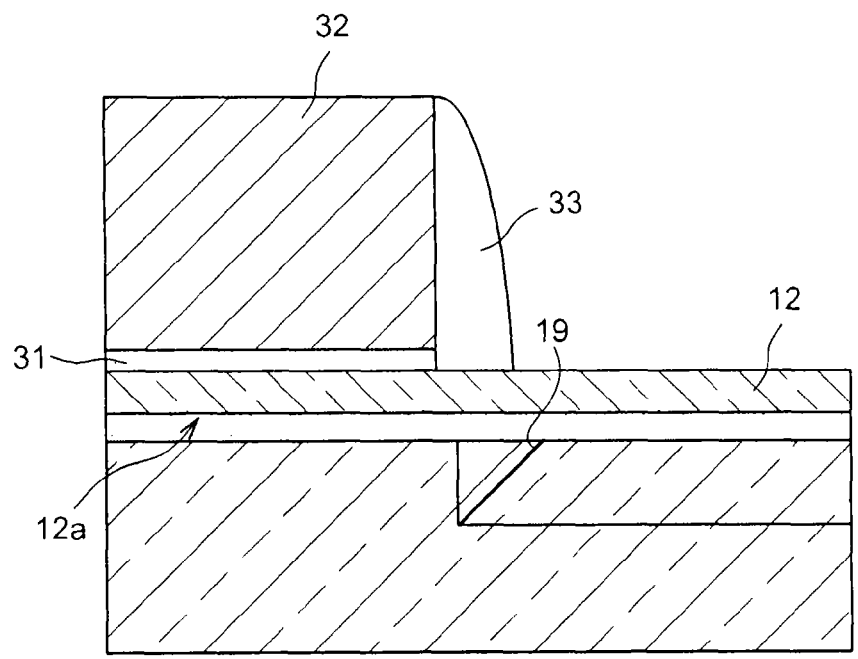

The next step is recrystallisation of regions 10b of the support layer 10 that were made amorphous (FIG. 2D).

The next step is to make at least one thermal annealing at a temperature that may be for example between 500° C. and 1100° C. in the case in which the insulating layer 11 is based on $SiO_2$ and the support layer 10 is based on Si for the 501 case. The annealing duration adapted as a function of the chosen annealing temperature may for example in this case be between 5 s and 1 hour, the required annealing time reduces as the annealing temperature increases.

Recrystallisation fronts originating in regions 10a, 10c for which the crystalline structure was maintained, propagate during recrystallisation (propagation being illustrated by arrows in FIG. 2D) and will meet.

Recrystallisation of regions 10b of the support layer generate defects called dislocations in the crystalline material, that can occur at locations 19 at which propagation fronts meet. These dislocations induce a strain field, and therefore a strain.

The generated strain extends as far as the surface layer 12 and particularly in the first zone 12a in this layer. The strain induced by the dislocations is memorised at the end of this step.

The strain intensity applied to the first zone 12a depends particularly on the choice of thicknesses $e_1$, $e_2$, of the insulating layer 11 and the surface semiconducting layer, the implantation depth at which the point P is located, and the implantation and recrystallisation annealing parameters (time, temperature).

The stressor layer 21 can then be removed. This removal may for example be made by etching using dry etching, for example of the RIE («Reactive Ion Etching») type or wet etching using a hot ortho-phosphoric acid when the stressor layer is based on silicon nitride.

The next step (FIG. 2E), is to remove the stencil block 14. This removal may be for example be done by etching using HF when the stencil is based for example on silicon oxide.

The next step is particularly to form a gate 32 on the first zone 12a of the surface layer that was strained and that is located facing the first region 10a of the support layer and between the regions 10b made amorphous and then recrystallised during previous steps.

To achieve this, a gate dielectric layer 31 is deposited, for example based on $HfO_2$, followed by a gate block 32 on this zone 31. The gate block may be formed from a material such as polysilicon or several stacked materials, for example a metal material such as TiN and a semiconducting material such as Polysilicon.

The next step may be to form insulating spacers 33, for example based on $Si_3N_4$, in contact with the side flanks of the gate.

Formation of the transistor is completed by forming source and drain zones (step not shown) using one or several semiconducting material growth steps by epitaxy on zones 12b of the surface layer.

Figure 3A:
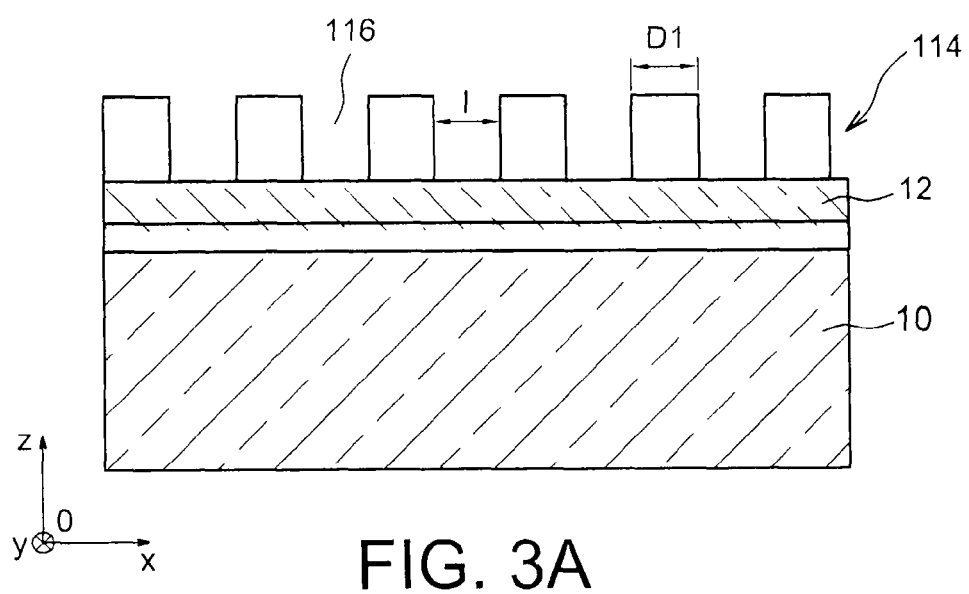
FIGS. 3A-3D, 4 illustrate a variant of the method in which the stencil is applied in the form of a plurality of blocks arranged facing the active zone of the transistor.

According to another embodiment, the density of dislocations generated in the support layer 10 of the substrate is increased by providing an amorphising implantation stencil in the form of a plurality of distinct parallel blocks 114 at a spacing from each other facing the first zone 12a of the surface semiconducting layer 12 in which the transistor channel will be made (FIG. 3A).

The generated strain field can thus be increased as it propagates into the surface semiconducting layer 12, by increasing the density of dislocations generated in the support layer 10.

The stencil blocks 114 may be elongated in shape, for example they may have a parallelepipedic shape, as a function of the required shape of the openings 116 located between these blocks.

Figure 4:
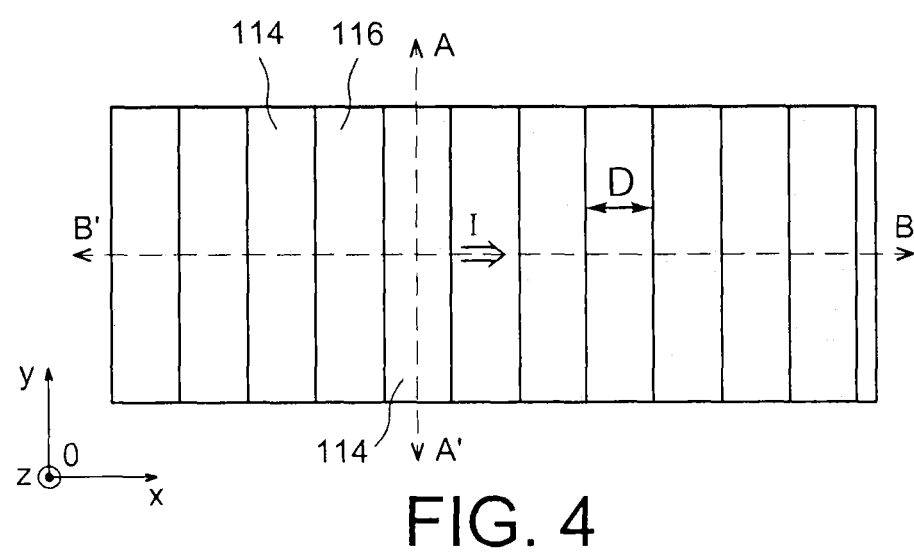

According to one possible embodiment (FIG. 4 illustrating a top view of the stencil), the stencil may be arranged in a lattice of parallel blocks 114, the pitch of which is adapted as a function of the density of regions that are to be amorphised and dislocations that are to be formed in this way in the support layer 10. The orientation of the blocks may also be selected as a function of the direction in which a current will circulate in the transistor channel zone. Openings 116 between the stencil blocks may then also be arranged in a lattice of parallel openings.

The orientation of the stencil blocks 114 is such that these stencil blocks extend along the direction of their length (defined in FIGS. 3A and 4 as a dimension parallel to the y axis), along an A'A axis orthogonal to a B'B axis (corresponding to the axis along which the channel length is measured) through which the first zone 12a of the surface layer 12 will pass and showing the direction along which a current I will circulate in the first zone 12a between a source zone and a drain zone of the transistor.

In this embodiment, the critical dimension Dn1 also called the width D1 (measured parallel to the x axis in FIG. 3A) and the spacing I (corresponding to the critical dimension of openings 116) of stencil blocks 114 are such that the sum I+D1 is less than the critical dimension of the transistor gate dc that will be made later (see FIG. 6).

The critical width or dimension D1 may be for example between 15 and 25 nm. The spacing I between stencil blocks 114 may for example be between 15 and 25 nm.

Figure 3B:
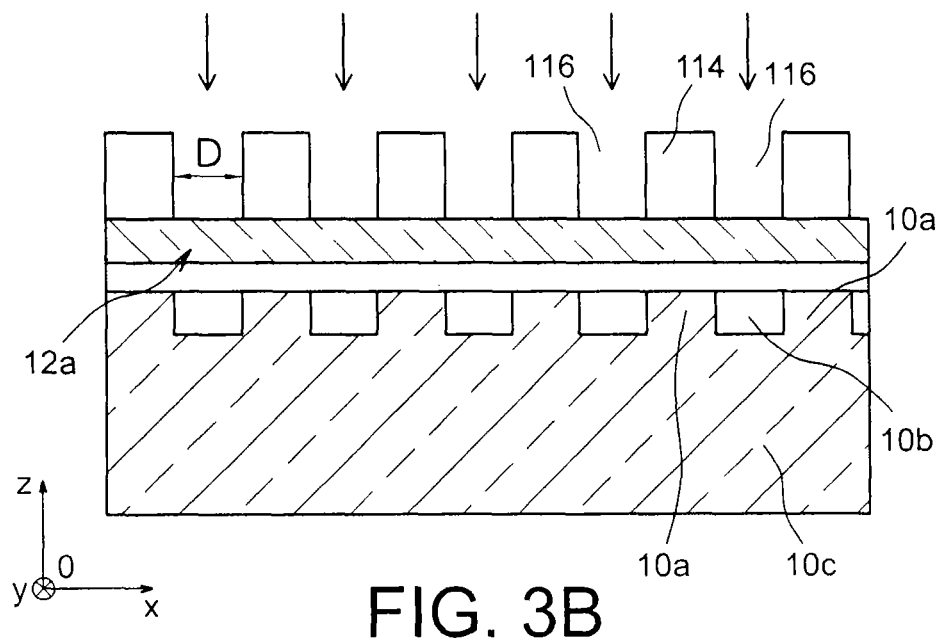

A "buried" amorphisation of regions 10b in the support layer 10 is then made by implantation through the openings 116 in the stencil located between blocks 114. The regions 10b of the support layer 10 that are not protected by the stencil and are located facing the openings 116 and facing the zone 12a are thus made amorphous (FIG. 3B). There are several stencil openings 116 located facing zone 12a of the surface layer in which a transistor channel will be made. Thus, at least two openings 116 in the stencil and at least one stencil block 114 located between these two openings are arranged facing the zone 12a in the surface semiconducting layer in which the transistor channel will be made. Thus, at least one non-amorphised crystalline portion 10a of the support layer 10 is kept after amorphisation, facing zone 12a between two regions 10b made amorphous.

The stressor layer 21 is then formed by conforming deposition on the stencil blocks 14 and on the surface semiconducting layer 12.

For example in a case in which the surface layer 12 is based on a strained semiconducting material, for example if the initial substrate is of the strained semiconductor on insulator type, the material in the mechanical stressor layer may be applied such that it applies a mechanical strain of the type opposite the type of the mechanical strain of the semiconducting material, for example a tensile strain when the semiconducting material is in bi-axial compression. This thus limits the global strain applied on the material in the surface layer 12 along a direction of the A'A axis orthogonal to the direction along which a current will circulate between the source and the drain and thus improve transistor performances, particularly when the channel length is expected to be short, for example less than 1 μm.

For example, in a case in which the surface layer is based on a semiconducting material such as strained SiGe with a bi-axial straining in compression, for example if the initial substrate is of the sSiGeOI (strained SiGe On Insulator) type, the stressor layer 21 may be based on a material strained in tension such as SixNy.

Figure 3C:
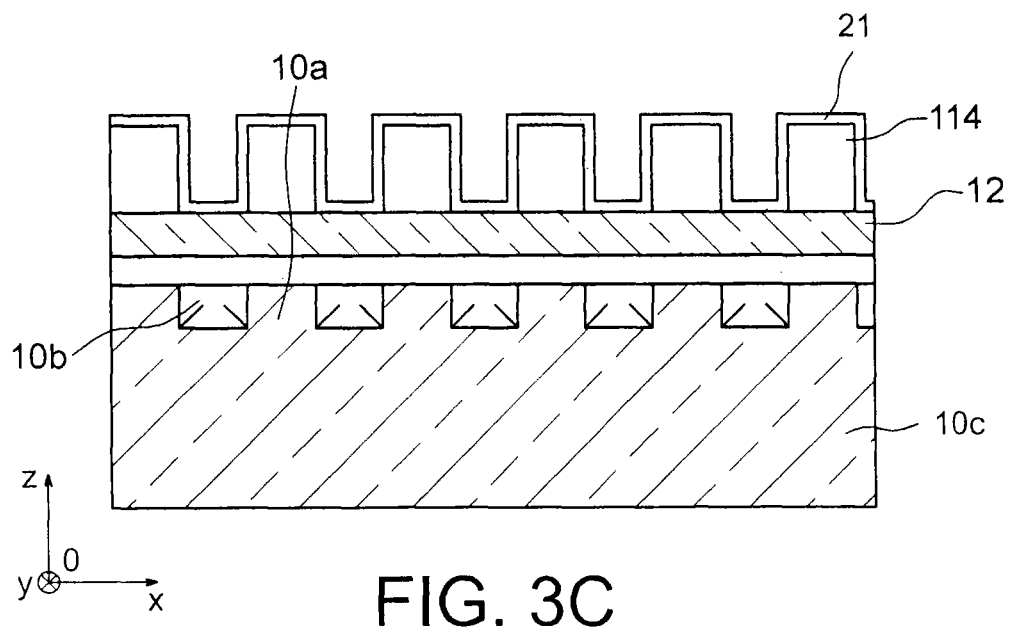

The next step is recrystallisation annealing of the regions 10a of the support layer making use of the other regions 10a, 10c in this layer for which the crystalline structure was kept as initial regions with recrystallisation fronts (FIG. 3C).

Thus, dislocations are generated inducing strains as far as the surface semiconducting layer 12. This embodiment can create more defects or dislocations facing the zone 12a in which the channel will be made, than a method in which only a single opening 116 in the implantation stencil is to be made facing the channel zone. Therefore this embodiment can apply a higher strain in the channel zone than is possible with a method in which there is a single opening 116 in the implantation stencil facing the channel zone.

The stressor layer 21 and the stencil blocks 114 are then removed.

Figure 3D:
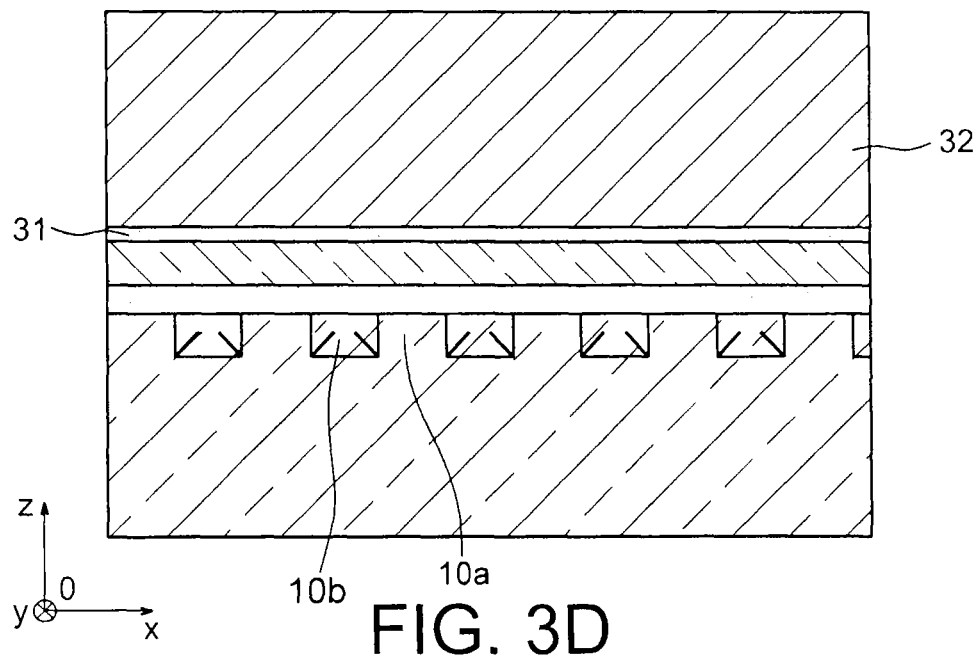

The result is that a gate dielectric 31 and a gate 32 are formed facing several regions 10b in the support layer 10 that were made amorphous and then recrystallised (FIG. 3D). The result is that the gate is formed facing a region in the support layer in which the density of dislocations is increased.

Other steps for the production of insulating spacers, formations of elevated source and drain zones can then be made to complete the formation of the transistor.

Figure 5:
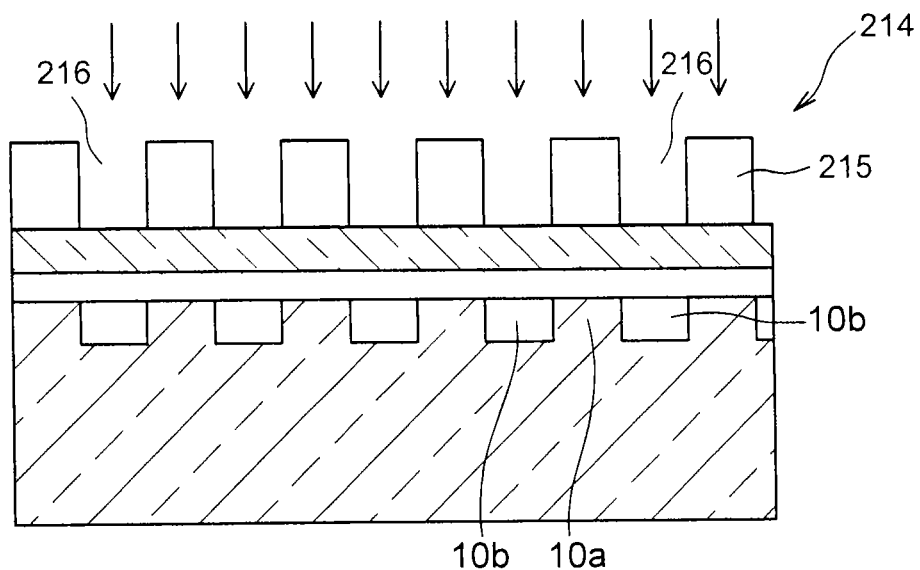
FIG. 5 illustrates a variant of the method in which the stencil used during the amorphisation step is also used to strain the substrate during the recrystallisation step.

According to one variant embodiment of one of the examples of the method described above, the amorphisation step can be performed through openings in a stencil 214 used both for protection of some zones of the substrate during the ionic implantation and for applying a mechanical strain on the support layer 10 and the surface layer 12 of the substrate (FIG. 5).

Thus, the first step is to form this stencil 214 that may be based on a material 215 with an intrinsic elastic strain for example such as SiN, adapted to induce a mechanical strain in the substrate.

The next step is implantation of regions 10a of the support layer 10 through openings of the stencil 214.

The next step is the recrystallisation annealing of regions 10a in the support layer.

The next step is to remove the stencil 121, for example by etching using ortho-phosphoric acid when the stencil is based on silicon nitride SiN.

The next step is to form a gate 32 facing several zones 10a that have been made amorphous and then recrystallised.

A source zone 41 and a drain zone 42 can then be formed.

Figure 6:
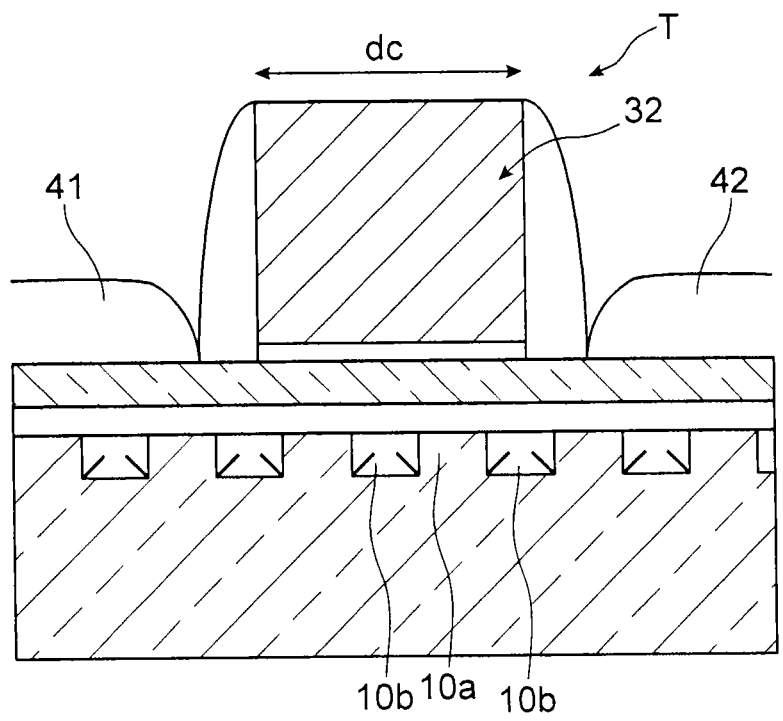
FIG. 6 illustrates a variant of the method in which the transistor gate is formed facing several regions made amorphous and then recrystallised in the support layer of the semiconductor on insulator type substrate.

FIG. 6 shows an example embodiment in which the zones made amorphous and then recrystallised are also made facing the source and drain zones.

According to one possible embodiment of one of the example methods that have just been described, the transistor T for which the channel is strained may use the FD-SOI (Fully Depleted Silicon On Insulator) or UTBB (Ultra Thin Body and Box) technology, in other words with an ultra-thin insulating layer 11, particularly with a thickness of between 5 nm and 25 nm just below an ultra-thin channel particularly with a thickness of between 3 nm and 25 nm and that is not doped.

As a variant to any of the examples that have just been described, the method according to the invention could advantageously be performed on a semiconductor on insulator substrate in which the surface layer is based on a semiconducting material other than Si, for example a III-V type material.

The invention claimed is:

1. A method for making a transistor with a strained channel on a semiconductor on insulator type substrate comprising a support layer, a surface semiconducting layer and an insulating layer separating the support layer and the surface semiconducting layer, the method comprising:
- a) forming a stencil on the surface semiconducting layer provided with a plurality of openings, at least two openings in the stencil and at least one stencil block located between the two openings being arranged facing a first zone in the surface semiconducting layer in which a transistor channel is provided,
- b) making regions in the support layer that are not protected by the stencil and are facing the openings and the first zone of the surface semiconducting layer amorphous, to keep at least one non-amorphised crystalline portion of the support layer, between two amorphous regions,
- c) recrystallizing said amorphous regions to form recrystallised regions in the support layer, recrystallisation being made such that a mechanical strain is applied on the substrate during this recrystallisation through a stressor layer deposited on the substrate,
- d) removing the stencil and the stressor layer,
- e) forming a gate for the transistor on the first zone of the surface semiconducting layer, the gate facing the recrystallised regions.

2. The method according to claim 1, wherein the stressor layer is deposited after the stencil has been formed and before recrystallisation.

3. The method according to claim 1, wherein the stencil is based on a strained material, the stencil forming the stressor layer during step c).

4. The method according to claim 1, wherein at least one opening in the stencil exposes a second zone of the surface semiconducting layer in which or on which a source or drain zone of the transistor is made or is to be made.

5. The method according to claim 1, wherein the stencil blocks are elongated parallel blocks that extend along the direction of their length along a predetermined direction, this predetermined direction being orthogonal to a given axis passing through the first zone of the surface semiconducting layer, this axis being parallel to a direction along which a current is to be circulated in the first zone between a source zone and a drain zone of the transistor.

6. The method according to claim 5, wherein in step a), the surface semiconducting layer is based on a strained semiconducting material, the mechanical strain applied by the stressor layer in step c) being a mechanical strain of the type opposite to the type of the mechanical strain of this material.

7. The method according to claim 6, wherein in step a), the substrate is of the sSiGeOI («strained Silicon Germanium On insulator») type provided with an SiGe surface layer strained in biaxial compression, the mechanical strain applied in step c) by the stressor layer being a mechanical tension strain.

8. The method according to claim 1, wherein the thickness of the surface semiconducting layer is less than 25 nm and the thickness of the insulating layer is less than 25 nm.

9. The method according to claim 1, wherein the surface semiconducting layer is based on an III-V material.

* * * * *